(12) United States Patent
Ito

(10) Patent No.: US 9,628,087 B2
(45) Date of Patent: Apr. 18, 2017

(54) RADIO TRANSMISSION APPARATUS

(71) Applicant: Seiko Epson Corporation, Tokyo (JP)

(72) Inventor: Hisahiro Ito, Minowa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 15/135,901

(22) Filed: Apr. 22, 2016

(65) Prior Publication Data

US 2016/0329901 A1 Nov. 10, 2016

(30) Foreign Application Priority Data

May 8, 2015 (JP) ................................. 2015-095501

(51) Int. Cl.
*H03L 1/00* (2006.01)
*H03L 1/02* (2006.01)
*H04B 1/04* (2006.01)
*H03L 7/197* (2006.01)

(52) U.S. Cl.
CPC ............ *H03L 1/028* (2013.01); *H03L 7/1974* (2013.01); *H04B 1/04* (2013.01)

(58) Field of Classification Search
CPC .......... H03L 1/022; H03L 7/00; H03L 7/1974
USPC ....................................... 331/176, 116 R, 44
See application file for complete search history.

(56) References Cited

U.S. PATENT DOCUMENTS

| | | | | |
|---|---|---|---|---|
| 8,314,662 | B2 * | 11/2012 | Isohata | H03L 1/026 331/154 |
| 8,648,431 | B2 * | 2/2014 | Abe | H03H 9/02566 257/245 |
| 9,030,078 | B2 * | 5/2015 | Il | H03H 3/02 310/333 |
| 9,093,634 | B2 * | 7/2015 | Il | H03H 9/177 |
| 9,106,237 | B2 * | 8/2015 | Ishikawa | H03L 1/023 |
| 9,252,782 | B2 | 2/2016 | Wilcox et al. | |
| 2013/0187720 | A1 * | 7/2013 | Ishii | H03L 7/00 331/44 |
| 2014/0292425 | A1 * | 10/2014 | Kozaki | H03K 19/00384 331/74 |
| 2015/0123740 | A1 * | 5/2015 | Itasaka | H03H 9/02102 331/107 R |
| 2016/0020789 | A1 | 1/2016 | Ito | |

FOREIGN PATENT DOCUMENTS

| | | |
|---|---|---|
| JP | 2008-085899 A | 4/2008 |
| JP | 2014-510455 A | 4/2014 |
| JP | 2016-025452 A | 2/2016 |
| WO | WO-2012-112621 A1 | 8/2012 |

* cited by examiner

*Primary Examiner* — Sonny Trinh
(74) *Attorney, Agent, or Firm* — Harness, Dickey & Pierce, P.L.C.

(57) ABSTRACT

A radio transmission apparatus includes a radio transmission IC including a vibration element and a fractional N-PLL circuit and a power amplifier generating a radio transmission signal and a control device that controls the radio transmission IC, and a temperature detection element. The control device controls the fractional N-PLL circuit based on temperature information obtained from the temperature detection element such that a frequency of the radio transmission signal is temperature-compensated.

20 Claims, 9 Drawing Sheets

RADIO TRANSMISSION APPARATUS

BACKGROUND

1. Technical Field

The present invention relates to a radio transmission apparatus.

2. Related Art

Since service providers can use specified low-power radio used for telemeter, telecontrol, data transmission, or the like without receiving license of radio stations in conformity to radio laws, the specified low-power radio has recently been used widely in various communication devices. In ARIB STD-T67 which is a standard of the specified low-power radio, multiple channels are defined at intervals of 12.5 kHz or intervals of 25 kHz in the 400 MHz bandwidth. Thus, in radio transmission apparatuses conforming to ARIB STD-T67, precision of a transmission frequency is requested to be within ±4 ppm in a full temperature range to be used in each channel to be used. In the related art, a radio transmission apparatus in which the request for such frequency precision is difficult includes a temperature compensated crystal oscillator (TCXO), a radio transmission integrated circuit (IC), and a controller, as illustrated in FIG. 11. The request for frequency precision has been satisfied by performing frequency conversion on an output signal of the temperature compensated crystal oscillator (TCXO) by the radio transmission IC under the control of the controller and generating a carrier wave of a desired frequency. Such a radio transmission apparatus is disclosed in, for example, JP-A-2008-85899.

However, since the temperature compensated crystal oscillator (TCXO) is an expensive component, there is a problem that a radio transmission apparatus of the related art including a temperature compensated crystal oscillator (TCXO) is necessarily expensive. In particular, since low cost is necessary in a miniature radio device such as a restaurant order-bell, it is difficult to use an expensive component such as a temperature compensated crystal oscillator (TCXO) included in a radio transmission apparatus.

SUMMARY

An advantage of some aspects of the invention is that it provides a radio transmission apparatus capable of realizing the same frequency precision as that of a radio transmission apparatus of the related art including a temperature compensated crystal oscillator (TCXO) further inexpensively.

The invention can be implemented as the following forms or application examples.

Application Example 1

A radio transmission apparatus according to this application example includes: a vibration element; a radio transmission semiconductor device that includes a fractional N-PLL circuit generating a radio transmission clock signal based on an output signal of the vibration element and a power amplifier generating a radio transmission signal based on the clock signal; a control device that controls the radio transmission semiconductor device; and a temperature detection element that is connected to the control device. The control device controls the fractional N-PLL circuit based on temperature information obtained from the temperature detection element such that a frequency of the radio transmission signal is temperature-compensated.

In the radio transmission apparatus according to this application example, the control device can generate the radio transmission signal which is temperature-compensated appropriately without using an expensive temperature compensated crystal oscillator (TCXO) by adding the frequency temperature characteristics of the vibration element based on temperature information obtained from the temperature detection element and controlling the fractional N-PLL circuit. Accordingly, the radio transmission apparatus according to the application example can realize the same frequency precision as a radio transmission apparatus of the related art in which a temperature compensated crystal oscillator (TCXO) is included further inexpensively.

In the radio transmission apparatus according to this application example, the frequency of the transmission clock signal output by the fractional N-PLL circuit can be digitally set with excellent linearity. Therefore, an influence of manufacturing variation is smaller than in a temperature compensated crystal oscillator (TCXO) performing temperature compensation of an analog scheme and temperature compensation adjustment is also easy.

Application Example 2

In the radio transmission apparatus according to the application example, the temperature detection element may be a thermistor that detects temperature of the vibration element.

Application Example 3

In the radio transmission apparatus according to the application example, the vibration element may be an AT vibration element.

In the AT vibration element, the frequency temperature characteristics exhibit a cubic curve which has an inflexion point near 25° C. and a frequency deviation is relatively small in a broad temperature range (for example, −40° C. to +85° C.). Accordingly, in the radio transmission apparatus according to the application example, it is possible to set a frequency variable range and a resolution of the frequency of the fractional N-PLL circuit so that the temperature characteristics of the vibration element can be sufficiently compensated.

Application Example 4

In the radio transmission apparatus according to the application example, the radio transmission semiconductor device and the vibration element may be accommodated in one package.

According to this application example, it is possible to realize the miniature radio transmission apparatus compared to a case in which the radio transmission semiconductor device and the vibration element accommodated in separate packages are flatly disposed on the same substrate.

Application Example 5

In the radio transmission apparatus according to the application example, the temperature detection element and the vibration element may be accommodated in one package.

In the radio transmission apparatus according to this application example, it is possible to realize the miniature radio transmission apparatus compared to a case in which the temperature detection element and the vibration element accommodated in separate packages are flatly disposed on the same substrate.

In the radio transmission apparatus according to this application example, since the vibration element and the temperature detection element are disposed at spatially close positions one another, a difference between the actual temperature of the vibration element and the temperature detected by the temperature detection element decreases. As a result, since a temperature compensation error decreases, it is possible to improve the frequency precision of the radio transmission signal.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail with reference to the drawings. The embodiments to be described below do not inappropriately limit content of the invention described in the appended claims. All of the elements to be described below may not be essential elements of the invention.

1. Radio Transmission Apparatus 1-1. First Embodiment

Configuration of Radio Transmission Apparatus

Figure 1:
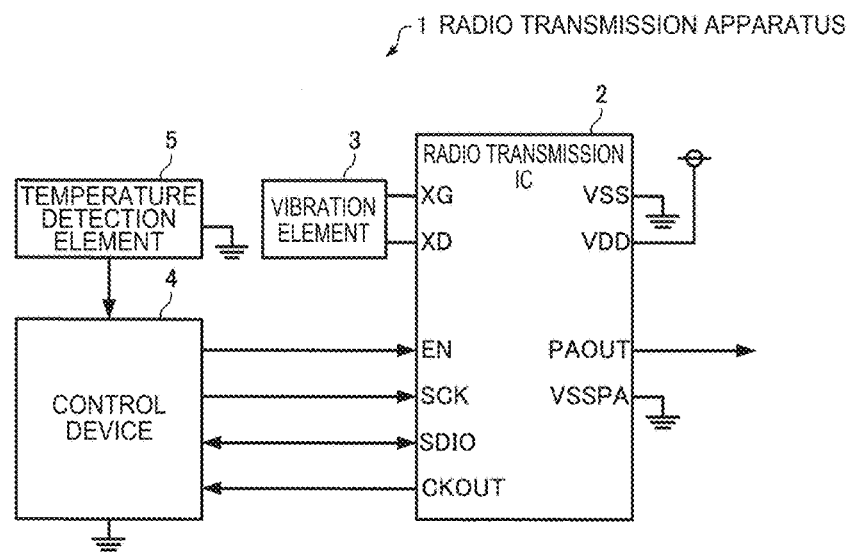
FIG. 1 is a diagram illustrating the configuration of a radio transmission apparatus according to a first embodiment.

FIG. 1 is a diagram illustrating the configuration of a radio transmission apparatus according to a first embodiment. As illustrated in FIG. 1, a radio transmission apparatus 1 according to the first embodiment is configured to include a radio transmission integrated circuit (IC) 2 (which is an example of a radio transmission semiconductor device), a vibration element 3, a control device 4, and a temperature detection element 5.

In the embodiment, the radio transmission IC 2 includes ten XG, XD, EN, SCK, SDIO, VSS, VDD, PAOUT, VSSPA, and CKOUT terminals.

The XG and XD terminals of the radio transmission IC 2 are electrically connected to two excitation elements (not illustrated) of the vibration element 3 (vibration element), respectively.

The EN, SCK, and SDIO terminals of the radio transmission IC 2 are terminals for 3-wire serial peripheral interface (SPI) communication with the control device 4 and are an enable input terminal, a clock input terminal, and a data input terminal in order.

The VSS terminal of the radio transmission IC 2 is a ground terminal which supplies a ground potential (0 V) to each circuit, excluding a power amplifier 23 (see FIG. 2) to be described below. The VDD terminal is a power terminal which supplies a power voltage (for example, 3 V) to each circuit.

The PAOUT terminal of the radio transmission IC 2 is an output terminal of a radio transmission signal from the power amplifier 23. The VSSPA terminal is a ground terminal which supplies the ground potential (0 V) to the power amplifier 23.

The CKOUT terminal of the radio transmission IC 2 is an output terminal of a clock signal from an oscillation circuit 21 (see FIG. 2) to be described below. The clock signal output from the CKOUT terminal is used as an interruption signal or a clock signal of the control device 4.

The radio transmission IC 2 oscillates the vibration element 3, generates a radio transmission clock signal based on the output signal of the vibration element 3, and generates a radio transmission signal based on the clock signal.

As the vibration element 3, for example, a quartz crystal vibration element, a surface acoustic wave (SAW) resonance element, another piezoelectric vibration element, or a micro electromechanical systems (MEMS) vibration element can be used. As a substrate material of the vibration element 3, a piezoelectric single crystal such as quartz crystal, lithium tantalate, or lithium niobate, a piezoelectric material such as piezoelectric ceramics such as lead zirconate titanate, or a silicon semiconductor material can be used. As an excitation mechanism of the vibration element 3, a mechanism by a piezoelectric effect may be used or electrostatic driving by the Coulomb force may be used.

The control device 4 is a device that controls the radio transmission IC 2. Specifically, the control device 4 controls the radio transmission by the radio transmission IC 2 by writing desired setting values on various registers for radio transmission setting included in a logic circuit 24 (see FIG. 2) to be described below via the EN, SCK, and SDIO terminals of the radio transmission IC 2 and further transmitting a radio transmission command. The control device 4 may be, for example, a micro controller unit (MCU).

The temperature detection element 5 outputs a signal according to the surrounding temperature (for example, a voltage according to temperature). The temperature detection element 5 may be a positive polarity element that has a higher output voltage as temperature is higher or may be a negative polarity element that has a lower output voltage as temperature is higher. The temperature detection element 5 may be, for example, a thermistor.

The temperature detection element 5 is disposed near the vibration element 3 and detects the temperature of the vibration element 3 (more accurately, the temperature near the vibration element 3). For example, the temperature detection element 5 may be disposed alone near the vibration element 3. The temperature detection element 5 may be included in the radio transmission IC2 or the control device 4 and the radio transmission IC 2 or the control device 4 in which the temperature detection element 5 is included may be disposed near the vibration element 3.

In the embodiment, the control device 4 controls a fractional N-PLL circuit 22 (see FIG. 2) to be described below such that the frequency of the radio transmission signal output from the PAOUT terminal of the radio transmission IC 2 is temperature-compensated based on temperature information obtained from the temperature detection element 5. Then, the radio transmission apparatus 1 wirelessly transmits the radio transmission signal with high precision of the frequency which is temperature-compensated via an antenna (not illustrated).

Configuration of Radio Transmission IC

Figure 2:
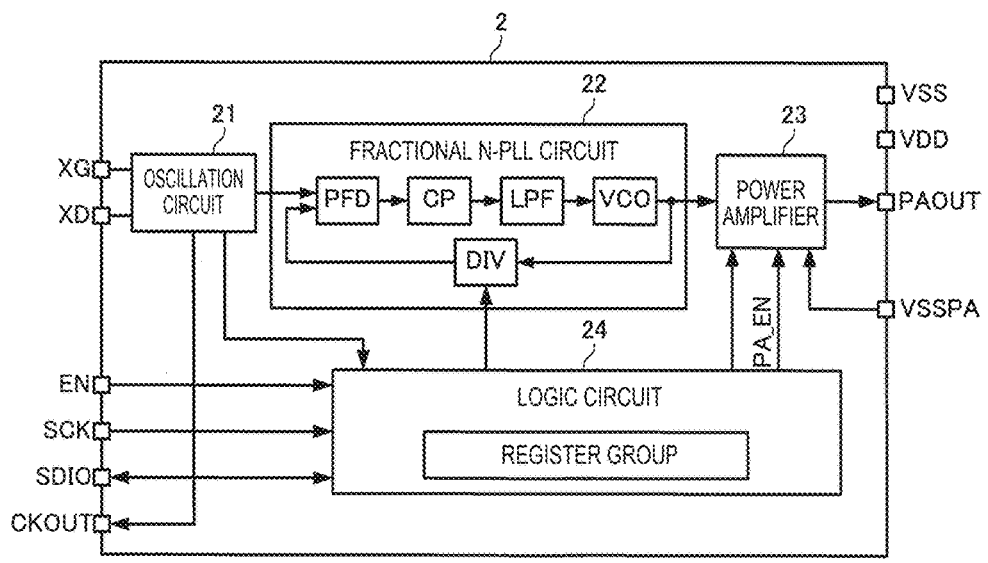
FIG. 2 is a diagram illustrating an example of the configuration of a radio transmission IC.

FIG. 2 is a diagram illustrating an example of the configuration of a radio transmission IC 2. In the example of FIG. 2, the radio transmission IC 2 is configured to include the oscillation circuit 21, the fractional N-PLL circuit 22, the power amplifier 23, and the logic circuit 24.

The oscillation circuit 21 is a circuit which oscillates the vibration element 3 electrically connected via the XG and XD terminals and amplifies an output signal of the vibration element 3 to give feedback to the vibration element 3. The oscillation circuit 21 generates a clock signal (oscillation signal) based on the oscillation of the vibration element 3 and outputs the clock signal to the fractional N-PLL circuit 22. The clock signal generated by the oscillation circuit 21 is output from the CKOUT terminal of the radio transmission IC 2 to be supplied as a clock signal or an interruption signal to the control device 4.

A circuit formed by the vibration element 3 and the oscillation circuit 21 may be any of various types of oscillation circuits such as a pierce oscillation circuit, an inverter type oscillation circuit, a colpitts oscillation circuit, and a Hartley oscillation circuit.

The fractional N-PLL circuit 22 is configured to include a phase comparator (phase frequency detector: PFD), a charge pump (CP), a lowpass filter (LPF), a voltage controlled oscillator (VCO), and a divider (DIV).

The phase comparator (PFD) compares phase differences of the clock signal output by the oscillation circuit 21 and the clock signal output by the divider circuit (DIV) and outputs a comparison result as a pulse voltage.

The charge pump (CP) converts the pulse voltage output by the phase comparator (PFD) into a current and the lowpass filter (LPF) performs smoothing and voltage conversion on the current output by the charge pump (CP).

The voltage controlled oscillator (VCO) uses the output voltage of the lowpass filter (LPF) as a control voltage and outputs the clock signal (which is a radio transmission clock signal) of which the frequency varies according to the control voltage.

The divider (DIV) outputs a clock signal obtained by dividing the clock signal output by the voltage controlled oscillator (VCO) by a division ratio according to the control signal input from the logic circuit 24.

The fractional N-PLL circuit 22 having such a configuration multiplies the frequency (for example, tens of MHz) of the clock signal from the oscillation circuit 21 according to the control signal input from the logic circuit 24 to generate a radio transmission clock signal (for example, a clock signal with hundreds of MHz) and outputs the radio transmission clock signal to the power amplifier 23.

The power amplifier 23 generates a radio transmission signal based on the radio transmission clock signal output by the fractional N-PLL circuit 22 and outputs the radio transmission signal. The radio transmission signal output by the power amplifier 23 is output from the PAOUT terminal. In the embodiment, when an enable signal PA_EN from the logic circuit 24 is active (at a high level in the embodiment), the power amplifier 23 generates and outputs a radio transmission signal with power (amplitude) according to the control signal from the logic circuit 24. When the enable signal PA_EN is inactive (at a low level in the embodiment), the power amplifier 23 stops an operation.

The logic circuit 24 operates in synchronization with the clock signal output by the oscillation circuit 21 and controls operations of the fractional N-PLL circuit 22 and the power amplifier 23. In the embodiment, when the EN terminal is active (at a high level in the embodiment), the logic circuit 24 receives a command or data input from the SDIO terminal in synchronization with the clock signal input from the SCK terminal and performs a process according to the received command and data. Specifically, the logic circuit 24 includes a register group formed by various registers for radio transmission setting. When the logic circuit 24 receives a register writing command, a register address, and setting data, the logic circuit 24 performs a process of writing the setting data on the register designated with the register address. When the logic circuit 24 receives the radio transmission command, the logic circuit 24 sets the enable signal PA_EN to be active (at the high level) at a predetermined timing and controls the frequency of the radio transmission clock signal output by the fractional N-PLL circuit 22 or the power of the radio transmission signal output by the power amplifier 23 according to setting values of various registers for radio setting and transmission data (wirelessly transmitted data) input from the SDIO terminal.

In the embodiment, the control device 4 can select one of frequency shift keying (FSK) modulation and amplitude shift keying (ASK) modulation as a modulation scheme of the radio transmission signal by the radio transmission IC 2. The modulation scheme of the radio transmission signal is designated with 1 bit of the radio transmission command.

Figure 3:
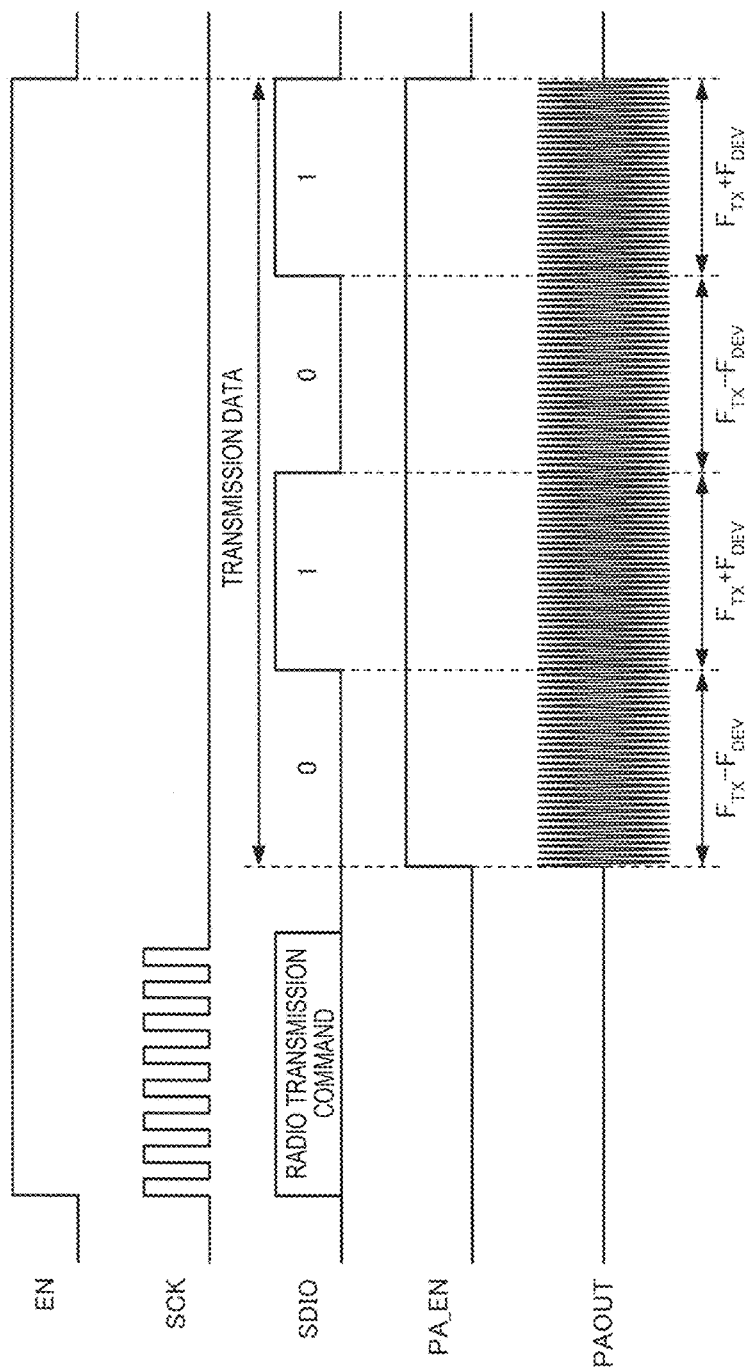
FIG. 3 is a timing chart illustrating examples of waveforms and timings of radio transmission signals.

FIG. 3 is a timing chart illustrating examples of waveforms and timings of radio transmission signals output from the PAOUT terminal in a case in which the frequency shift keying (FSK) modulation is selected. In FIG. 3, data to be transmitted wirelessly is 4 bits of "0", "1", "0", and "1".

As in the example of FIG. 3, for the radio transmission signal in the case in which the frequency shift keying (FSK) modulation is selected, a frequency (transmission frequency) corresponding to the transmission data "0" is $F_{TX}-F_{DEV}$ and a frequency (transmission frequency) corresponding to the transmission data "1" is $F_{TX}+F_{DEV}$ without a change in the constant amplitude. Here, $F_{TX}$ is a center frequency (carrier wave frequency) decided according to a setting value of the register and $F_{DEV}$ is a modulation width (modulation frequency) decided according to a setting value of the register.

In the embodiment, in the case in which the frequency shift keying (FSK) modulation is selected, the logic circuit 24 generates a control signal to control a division ratio of the fractional N-PLL circuit 22 based on the transmission data and the setting value of the register such that the transmission frequencies are $F_{TX}-F_{DEV}$ and $F_{TX}+F_{DEV}$ according to the transmission data "0" and "1".

Here, when N is assumed to be an integer part (integer division ratio) of the division ratio of the fractional N-PLL circuit 22 and F/M is a fraction part (fractional division ratio), a relation of formula (1) below is established between a frequency (reference frequency) $F_{REF}$ of the clock signal from the oscillation circuit 21 and a frequency $F_{PLL}$ of the clock signal output by the fractional N-PLL circuit 22.

$$F_{PLL} = \left(N + \frac{F}{M}\right) \times F_{REF} \qquad (1)$$

Accordingly, for example, the register group of the logic circuit 24 is provided with a register for setting the values of the integer division ratio N and the fraction division ratio F/M and a register for setting the modulation width (modulation frequency) $F_{DEV}$. Before the radio transmission command is transmitted, the control device 4 sets the desired modulation width (modulation frequency) $F_{DEV}$ in the register and sets the integer division ratio N and the fraction division ratio F/M in the register so that the frequency $F_{PLL}$ of the clock signal output by the fractional N-PLL circuit 22 is substantially identical to the center frequency (carrier wave frequency) $F_{TX}$ according to formula (1). After a radio transmission command by which the frequency shift keying (FSK) modulation is selected is received, the logic circuit 24 calculates a division ratio of the fractional N-PLL circuit 22 for each piece of transmission data using the setting values of the registers of the integer division ratio N, the fraction division ratio F/M, and the modulation width (modulation frequency) $F_{DEV}$ and performs delta-sigma modulation to generate a control signal of the fractional N-PLL circuit 22 so that a time average value of the division ratios is identical to the calculated value.

Figure 4:
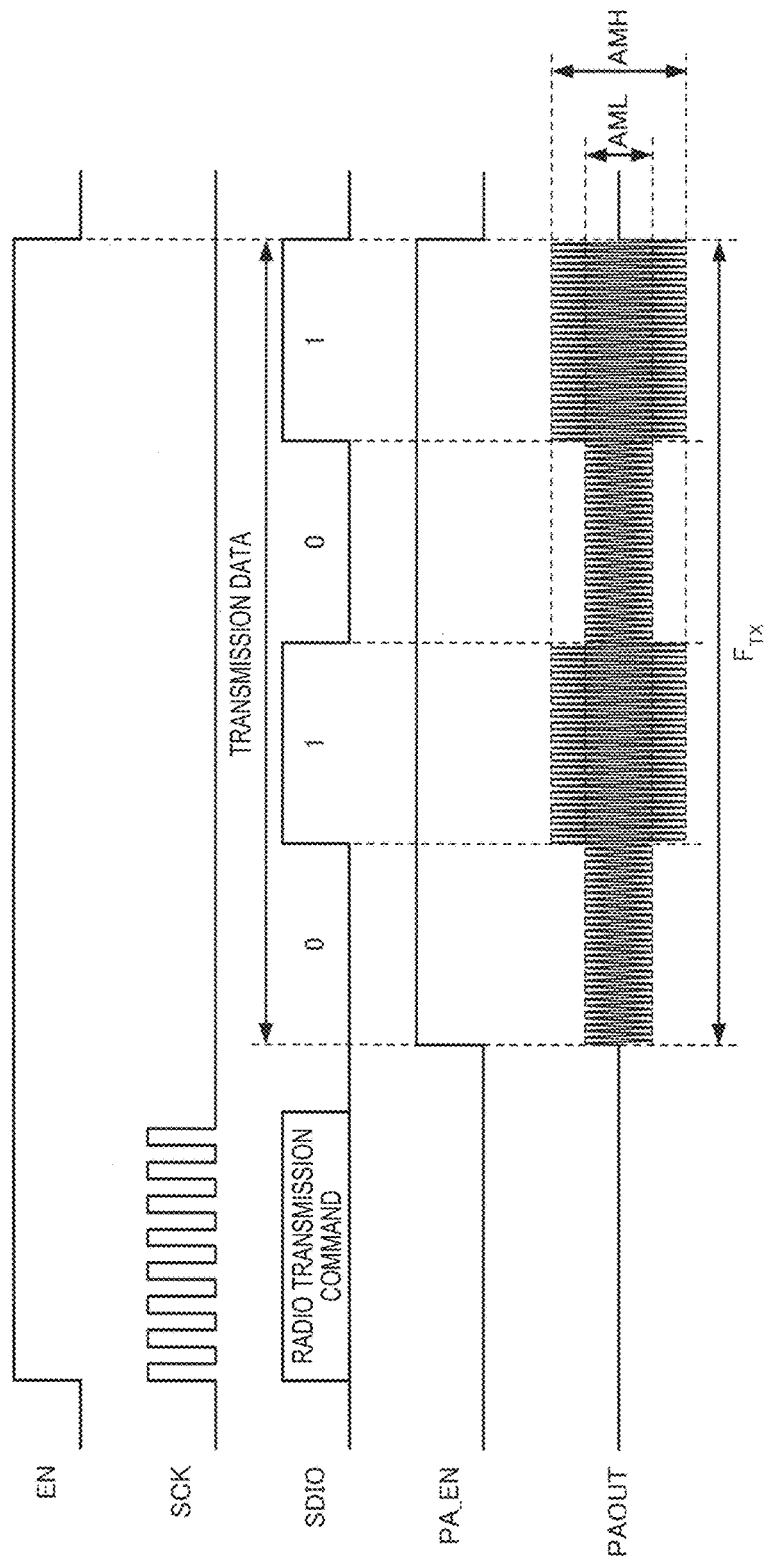
FIG. 4 is a timing chart illustrating examples of waveforms and timings of radio transmission signals.

FIG. 4 is a timing chart illustrating examples of waveforms and timings of radio transmission signals output from the PAOUT terminal in a case in which the amplitude shift keying (ASK) modulation is selected. In FIG. 4, data to be transmitted wirelessly is 4 bits of "0", "1", "0", and "1".

As in the example of FIG. 4, for the radio transmission signal in the case in which the amplitude shift keying (ASK) modulation is selected, the transmission frequency remains unchanged as the center frequency (carrier wave frequency) $F_{TX}$, the amplitude corresponding to the transmission data "0" becomes AML, and the amplitude corresponding to the transmission data "1" becomes AMH.

In the embodiment, in the case in which the amplitude shift keying (ASK) modulation is selected, the logic circuit 24 generates a control signal to control the division ratio of the fractional N-PLL circuit 22 based on the setting values of the registers so that the transmission frequency becomes $F_{TX}$. The logic circuit 24 generates a control signal to control an output amplitude of the power amplifier 23 based on the setting values of the registers and the transmission data so that the amplitude of the radio transmission signal output by the power amplifier 23 becomes AML or AMH according to the transmission data "0" and "1".

For example, the register group of the logic circuit 24 is provided with a register for setting the values of the integer division ratio N and the fraction division ratio F/M and a register for setting the amplitudes AML and AMH. Before the radio transmission command is transmitted, the control device 4 sets the desired amplitudes AML and AMH in the register and sets the integer division ratio N and the fraction division ratio F/M in the register so that the frequency $F_{PLL}$ of the clock signal output by the fractional N-PLL circuit 22 is substantially identical to the center frequency (carrier wave frequency) $F_{TX}$ according to formula (1). After a radio transmission command by which the amplitude shift keying (ASK) modulation is selected is received, the logic circuit 24 performs delta-sigma modulation using the setting values of the registers of the integer division ratio N and the fraction division ratio F/M to generate a control signal of the fractional N-PLL circuit 22 so that a time average value of the division ratios of the fractional N-PLL circuit 22 is identical to N+F/M. After the radio transmission command by which the amplitude shift keying (ASK) modulation is selected is received, the logic circuit 24 generates a control signal to control an output amplitude of the power amplifier 23 according to the transmission data using the setting values of the registers of amplitudes AML and AMH.

Incidentally, in a case in which a broad temperature range (for example, −40° C. to +85° C.) is defined as an operation guarantee temperature of the radio transmission apparatus 1, a frequency (reference frequency $F_{REF}$) of the clock signal output by the oscillation circuit 21 considerably varies according to the temperature due to the frequency temperature characteristics of the vibration element 3. Therefore, in the embodiment, the control device 4 has information regarding the frequency temperature characteristics of the vibration element 3 and calculates the division ratios (the integer division ratio N and the fraction division ratio F/M) of the fractional N-PLL circuit 22 so that the transmission frequency of the radio transmission signal is temperature-compensated and a desired frequency is maintained regardless of temperature based on the information regarding the frequency temperature characteristics and temperature information obtained from the output signal of the temperature detection element 5.

Then, as described above, before the radio transmission command is transmitted, the control device 4 sets the calculated integer division ratio N and fraction division ratio F/M in the register. Accordingly, the radio transmission IC 2 receiving the radio transmission command from the control device 4 can output the radio transmission signal with high frequency precision regardless of temperature.

In particular, in order to realize the radio transmission apparatus 1 in which the frequency precision of the radio transmission signal is equal to or less than ±4 ppm in conformity to ARIB STD-T67, the vibration element 3 is preferably an AT vibration element (AT cut quartz crystal vibration element). In the AT vibration element, the frequency temperature characteristics exhibit a cubic curve which has an inflexion point near 25° C. and a frequency deviation is relatively small in the broad temperature range (for example, −40° C. to +85° C.). Therefore, it is possible to set a variable range of the frequency of the clock signal output by the fractional N-PLL circuit 22, that is, a variable range of the division ratio N+F/M of the fractional N-PLL circuit 22, and a resolution of the division ratio N+F/M necessary to realize the frequency precision equal to or less than ±4 ppm so that the temperature characteristics of the vibration element 3 can be sufficiently compensated. Accordingly, it is possible to realize the miniature radio transmission apparatus 1 outputting the radio transmission signal with the high frequency precision.

Sequence of Radio Transmission

Figure 5:
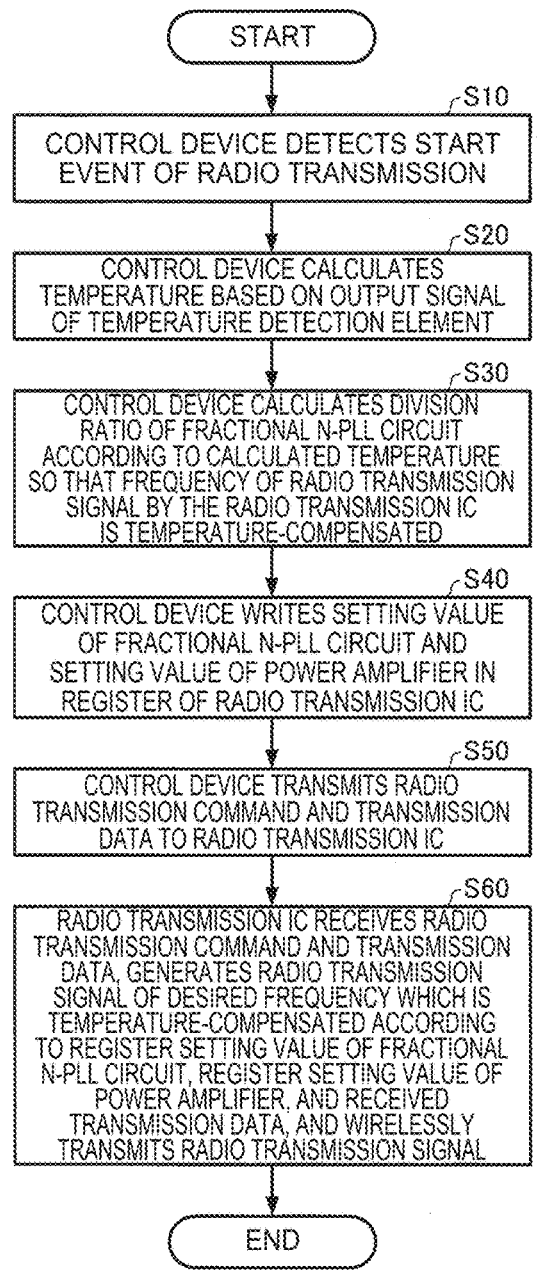
FIG. 5 is a flowchart illustrating an example of a sequence of radio transmission by the radio transmission apparatus according to an embodiment.

FIG. 5 is a flowchart illustrating an example of a sequence of radio transmission by the radio transmission apparatus 1.

In the example of FIG. 5, the control device 4 first detects a start event of the radio transmission (S10). For example, in a case in which a desired signal (for example, a signal indicating that a button or a switch is pushed) from an input device (a button, a switch, or the like) (not illustrated) is received, the control device 4 may detect the start event of the radio transmission or may detect the start event of the radio transmission whenever a preset certain time passes.

Next, the control device 4 calculates the temperature (acquires the temperature information) based on the output signal of the temperature detection element 5 (S20). For example, the control device 4 may maintain a calculation formula or table information indicating a relation between the output voltage and the temperature of the temperature detection element 5 and calculate the temperature using the calculation formula or the table information.

Next, the control device 4 calculates the division ratio of the fractional N-PLL circuit 22 according to the temperature calculated in step S20 so that the frequency of the radio transmission by the radio transmission IC 2 is temperature-compensated (S30). For example, the control device 4 maintains information regarding the frequency temperature characteristic of the vibration element 3, calculates the frequency $F_{REF}$ of the vibration element 3 at the temperature calculated in step S20 using the information regarding the frequency temperature characteristics, and calculates the integer division ratio N and the fraction division ratio F/M satisfying $F_{PLL}=F_{TX}$ from formula (1).

Next, the control device 4 writes the setting value of the fractional N-PLL circuit 22 and the setting value of the power amplifier 23 on the register of the radio transmission IC 2 (S40). That is, the control device 4 transmits the register writing command to the radio transmission IC 2 and writes the modulation width (the modulation frequency) $F_{DEV}$ of the radio transmission signal and the division ratios (the integer division ratio N and the fraction division ratio F/M) and the like calculated in step S30 as the setting values of the fractional N-PLL circuit 22 on the register. The control device 4 transmits the register writing command to the radio transmission IC 2 and writes the amplitudes AML and AMH of the radio transmission signal as the setting values of the power amplifier 23 on the register.

Next, the control device 4 transmits the radio transmission command and the transmission data to the radio transmission IC 2 (S50).

Finally, the radio transmission IC 2 receives the radio transmission command and the transmission data, generates the radio transmission signal of the desired frequency which is temperature-compensated according to the register setting value of the fractional N-PLL circuit 22, the register setting value of the power amplifier 23, and the received transmission data, and wirelessly transmits the radio transmission signal (S60).

After the start event of the radio transmission is detected in step S10, that is, immediately before the radio transmission is performed, the control device 4 acquires the output signal of the temperature detection element 5 in step S20 to decrease the difference between the temperature used to calculate the division ratio of the fractional N-PLL circuit 22 in step S30 and the temperature at the time of actual radio transmission in step S60, and therefore the temperature compensation precision can be improved and the radio transmission can be performed at high frequency precision.

Frequency Temperature Characteristics of Radio Transmission Signals

Figure 6:
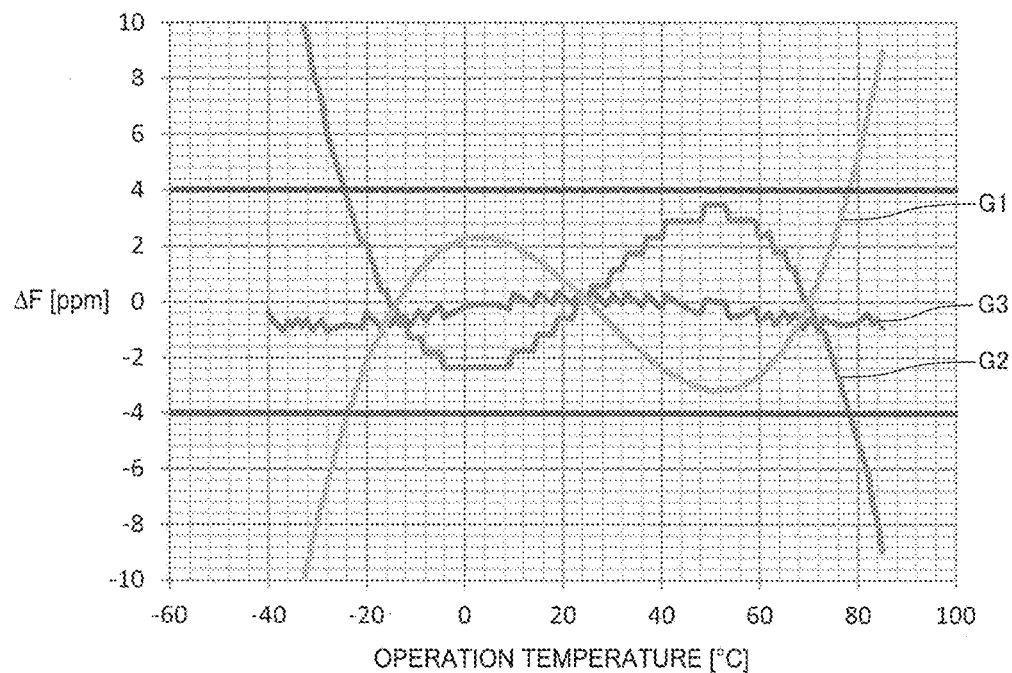
FIG. 6 is a diagram illustrating an example of frequency temperature characteristics of radio transmission signals output by the radio transmission apparatus according to the embodiment.

FIG. 6 is a diagram illustrating an example of the frequency temperature characteristics of radio transmission signals output by the radio transmission apparatus 1 according to the embodiment. The horizontal axis represents the operation temperature (unit: ° C.) of the radio transmission apparatus 1 and the vertical axis represents a frequency deviation ΔF (unit: ppm) of the radio transmission signal.

In FIG. 6, G1 is a graph which indicates an example of the frequency temperature characteristics of the vibration element 3 and corresponds to the temperature characteristics of the reference frequency $F_{REF}$ of formula (1). In the example of FIG. 6, the vibration element 3 indicates an AT vibration element and the graph G1 indicates a cubic curve which has an inflexion point near 25° C.

G2 is a graph which indicates an example of the frequency temperature characteristics (the temperature characteristics of the frequency $F_{PLL}$) of the clock signal output by the fractional N-PLL circuit 22 in a case in which the reference frequency $F_{REF}$ at 25° C. in formula 1 is assumed to be a fixed value (a value at 25° C.) regardless of temperature. In the example of FIG. 6, the setting resolution of a division ratio N+F/M of the fractional N-PLL circuit 22 is about 0.5 ppm and the graph G2 has the frequency characteristics reverse to the graph G1 using 0.5 ppm as a minimum unit.

G3 is a graph which indicates an example of the frequency temperature characteristics of the radio transmission signal output by the radio transmission apparatus 1 and corresponds to the temperature characteristics of the frequency $F_{PLL}$ of formula 1. The graph G3 corresponds to a difference between the graphs G1 and G2 and has the frequency temperature characteristics of the radio transmission signal which is temperature-compensated. In the example of FIG. 6, the frequency precision of the radio transmission signal equal to or less than ±4 ppm defined in ARIB STD-T67 is sufficiently achieved in the operation temperature range of −40° C. to +85° C.

The control device 4 may maintain, for example, a relation formula (approximation formula) or table information of the temperature and the frequency deviation corresponding to the graph G1 as the information regarding the frequency temperature characteristics of the foregoing vibration element 3, may maintain a relation formula (approximation formula) or table information of the temperature and the frequency deviation corresponding to the graph G2, or may maintain a relation formula (approximation formula) or table information of the division ratio N+F/M of the fractional N-PLL circuit 22 and the temperature used to obtain the graph G2.

Advantages

As described above, in the radio transmission apparatus 1 according to the first embodiment, the control device 4 can generate the radio transmission signal which is temperature-compensated appropriately using, for example, the inexpensive vibration element 3 such as an AT vibration element without using an expensive temperature compensated crystal oscillator (TCXO) by adding the frequency temperature characteristics of the vibration element 3 based on the temperature information obtained from the temperature detection element 5 and controlling the division ratio of the fractional N-PLL circuit 22. Accordingly, the radio transmission apparatus 1 according to the first embodiment can realize the same frequency precision as a radio transmission apparatus of the related art in which a temperature compensated crystal oscillator (TCXO) is included further inexpensively.

In the radio transmission apparatus 1 according to the first embodiment, the frequency of the transmission clock signal output by the fractional N-PLL circuit 22 can be digitally set with excellent linearity. Therefore, an influence of manufacturing variation is smaller than in a temperature compensated crystal oscillator (TCXO) performing temperature compensation of an analog scheme and control (temperature compensation adjustment) of the fractional N-PLL circuit 22 by the control device 4 is also easy.

1-2. Second Embodiment

Figure 7:
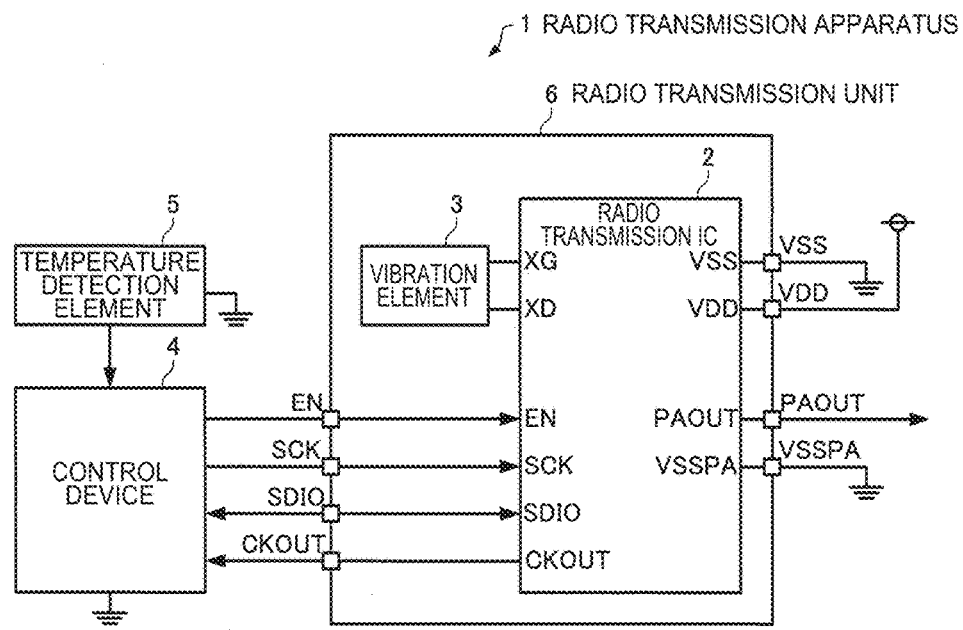
FIG. 7 is a diagram illustrating the configuration of a radio transmission apparatus according to a second embodiment.

FIG. 7 is a diagram illustrating the configuration of a radio transmission apparatus according to a second embodiment. In FIG. 7, the same reference numerals are given to the same constituent elements as those in FIG. 1. Hereinafter, the same reference numerals are given to the same configuration as that of the first embodiment. The different content from the first embodiment will be mainly described and the description of the common content to that of the first embodiment will be omitted or simplified. As illustrated in FIG. 7, a radio transmission apparatus 1 according to the second embodiment is the same as that of the first embodiment in that a radio transmission IC 2 (which is an example of a radio transmission semiconductor device), a vibration element 3, a control device 4, and a temperature detection element 5 are included, and the functions of the radio transmission IC 2, the vibration element 3, the control device 4, and the temperature detection element 5 are the same as those of the first embodiment. The radio transmission apparatus 1 is different from that of the first embodiment in that the radio transmission unit 6 is configured such that the radio transmission IC 2 and the vibration element 3 are accommodated in one package.

In the embodiment, the radio transmission unit 6 includes eight EN, SCK, SDIO, VSS, VDD, PAOUT, VSSPA, and CKOUT terminals provided on the surface of the package which are electrically connected to EN, SCK, SDIO, VSS, VDD, PAOUT, VSSPA, and CKOUT terminals of the radio transmission IC 2, respectively.

The EN, SCK, and SDIO terminals of the radio transmission unit 6 are terminals for 3-wire SPI communication with the control device 4 and are an enable input terminal, a clock input terminal, and a data input terminal in order.

The VSS terminal of the radio transmission unit 6 is a ground terminal which supplies a ground potential (0 V) to each circuit, excluding the power amplifier 23 (see FIG. 2) of the radio transmission IC 2. The VDD terminal is a power terminal which supplies a power voltage (for example, 3 V) to each circuit.

The PAOUT terminal of the radio transmission unit 6 is an output terminal of a radio transmission signal from the power amplifier 23 of the radio transmission IC 2. The VSSPA terminal is a ground terminal which supplies the ground potential (0 V) to the power amplifier 23 of the radio transmission IC 2.

The CKOUT terminal of the radio transmission unit 6 is an output terminal of a clock signal from the oscillation circuit 21 (see FIG. 2) of the radio transmission IC 2. The clock signal output from the CKOUT terminal is used as an interruption signal or a clock signal of the control device 4.

The control device 4 controls the radio transmission IC 2 via the EN, SCK, and SDIO terminals of the radio transmission unit 6.

In the second embodiment, the temperature detection element 5 is disposed near the radio transmission unit 6 and detects the temperature (the temperature of the vibration element 3) of the radio transmission unit 6. The temperature detection element 5 may be, for example, a thermistor. In the embodiment, the control device 4 controls the fractional N-PLL circuit 22 (see FIG. 2) of the radio transmission IC 2 such that the frequency of the radio transmission signal output from the PAOUT terminal of the radio transmission unit 6 is temperature-compensated based on temperature information obtained from the temperature detection element 5.

Figure 8A:
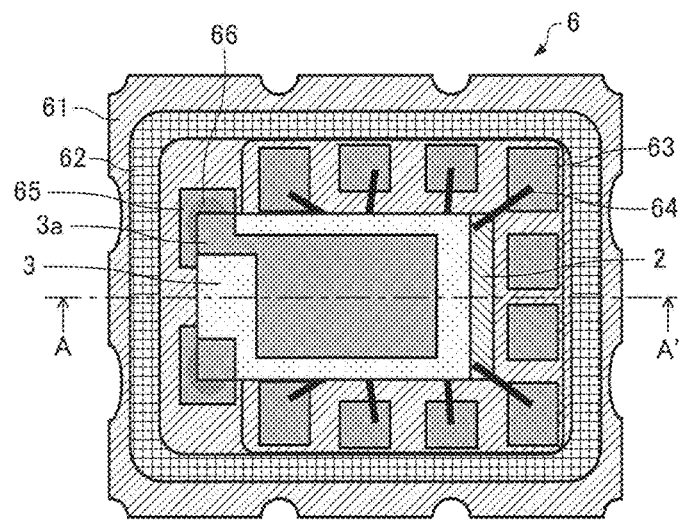
FIG. 8A is a top view illustrating a radio transmission unit.
Figure 8B:
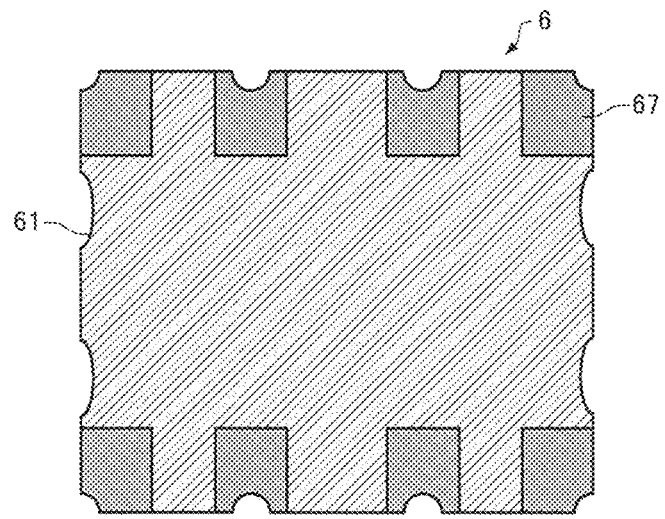
FIG. 8B is a bottom view illustrating the radio transmission unit.
Figure 8C:
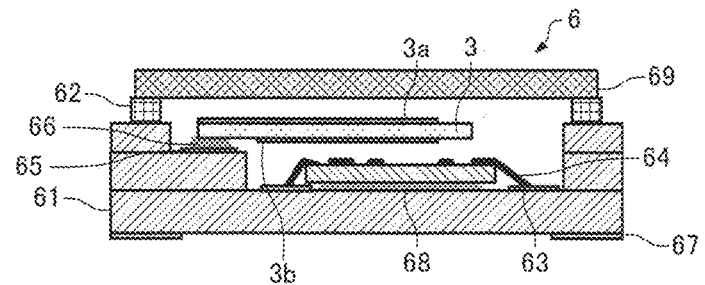
FIG. 8C is a bottom view illustrating the radio transmission unit.

FIGS. 8A to 8C are diagrams illustrating an example of the structure of the radio transmission unit 6. FIG. 8A is a top view illustrating the radio transmission unit 6. FIG. 8B is a bottom view illustrating the radio transmission unit 6. FIG. 8C is a sectional view illustrating the radio transmission unit 6 taken along the line VIIIC-VIIIC of FIG. 8A when viewed in a direction indicated by the arrow. FIG. 8A illustrates a state in which a lid 69 in FIG. 8C is not present.

As illustrated in FIGS. 8A to 8C, the radio transmission unit 6 is configured to include the radio transmission IC 2, the vibration element (vibration element) 3, a package 61, a seaming ring 62, and the lid (cover) 69.

The package 61 accommodates the radio transmission IC 2 and the vibration element 3 in the same space. Specifically, an opening is formed in the upper surface of the package 61 and the seaming ring 62 disposed to surround the opening of the package 61 and the lid 69 are welded to seal the opening of the package 61, so that the radio transmission IC 2 and the vibration element 3 are accommodated in the same space.

The vibration element 3 includes metal excitation electrodes 3a and 3b on the front and rear surfaces, respectively, and oscillates at a desired frequency according to the mass or the shape of the vibration element 3 including the excitation electrodes 3a and 3b. The vibration element 3 may be, for example, an AT vibration element. The vibration element 3 is fixed to electrode pads 65 disposed on the package 61 by a connection member 66 such as a conductive adhesive. The radio transmission IC 2 is joined to the package 61 by an adhesive member 68 such as lysine.

The XG, XD, EN, SCK, SDIO, VSS, VDD, PAOUT, VSSPA, and CKOUT terminals of the radio transmission IC 2 and electrode pads 63 disposed on the package 61 are bonded by bonding wires 64 such as gold.

Wires (not illustrated) electrically connecting the two electrode pads 63 respectively bonded with the XG and XD terminals of the radio transmission IC 2 to the two electrode pads 65 connected to two terminals (the excitation electrodes 3a and 3b) of the vibration element 3 are provided inside or on the front surface of the package 61.

Wires (not illustrated) electrically connecting the eight electrode pads 63 respectively bonded with the EN, SCK, SDIO, VSS, VDD, PAOUT, VSSPA, and CKOUT terminals of the radio transmission IC 2 to eight EN, SCK, SDIO, VSS, VDD, PAOUT, VSSPA, and CKOUT terminals (electrodes) 67 provided on the bottom surface of the package 61 are provided inside or on the front surface of the package 61.

In this way, according to the second embodiment, as illustrated in FIGS. 8A to 8C, the radio transmission IC 2 and the vibration element 3 are accommodated in one package 61. Further, in a plan view when the radio transmission unit 6 is viewed from the upper surface, the radio transmission IC 2 and the vibration element 3 overlap each other. Therefore, the radio transmission apparatus 1 can be miniaturized compared to a case in which the radio transmission IC 2 and the vibration element 3 accommodated in separate packages are flatly disposed on the same substrate.

1-3. Third Embodiment

Figure 9:
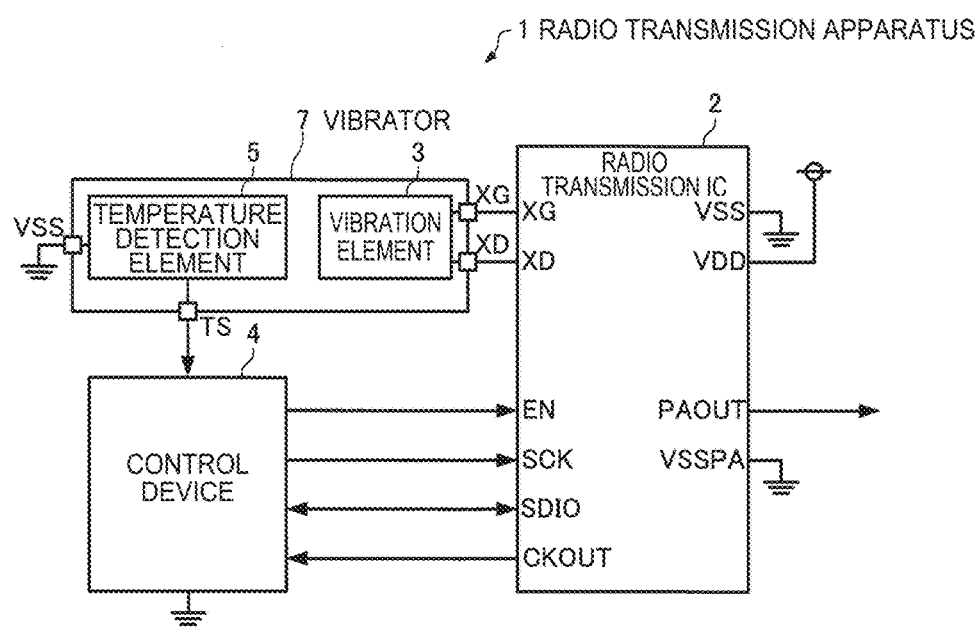
FIG. 9 is a diagram illustrating the configuration of a radio transmission apparatus according to a third embodiment.

FIG. 9 is a diagram illustrating the configuration of a radio transmission apparatus according to a third embodiment. In FIG. 9, the same reference numerals are given to the same constituent elements as those in FIG. 1. Hereinafter, the same reference numerals are given to the same configuration as that of the first embodiment. The different content from the first embodiment will be mainly described and the description of the common content to that of the first embodiment will be omitted or simplified. As illustrated in FIG. 9, a radio transmission apparatus 1 according to the third embodiment is the same as that of the first embodiment in that a radio transmission IC 2 (which is an example of a radio transmission semiconductor device), a vibration element 3, a control device 4, and a temperature detection element 5 are included, and the functions of the radio transmission IC 2, the vibration element 3, the control device 4, and the temperature detection element 5 are the same as those of the first embodiment. The radio transmission apparatus 1 is different from that of the first embodiment in that a vibrator 7 is configured such that the temperature detection element 5 and the vibration element 3 are accommodated in one package.

In the embodiment, the vibrator 7 includes four XG, XD, TS, and VS terminals provided on the front surface of the package.

The XG and XD terminals of the vibrator 7 are electrically connected to two excitation electrodes (not illustrated) of the vibration element 3 (vibration element) and XG and XD terminals of the radio transmission IC 2, respectively.

The TS terminal of the vibrator 7 is electrically connected to an output terminal of the temperature detection element 5, and thus an output signal of the temperature detection element 5 output from the TS terminal is input to the control device 4.

The VSS terminal of the vibrator 7 is a ground terminal which supplies the ground potential (0 V) to the temperature detection element 5.

In the third embodiment, the temperature detection element 5 in the vibrator 7 detects the temperature of the vibration element 3. The control device 4 controls the fractional N-PLL circuit 22 (see FIG. 2) of the radio transmission IC 2 such that the frequency of the radio transmission signal output from the PAOUT terminal of the radio transmission IC 2 is temperature-compensated based on temperature information obtained from the TS terminal of the vibrator 7.

Figure 10A:
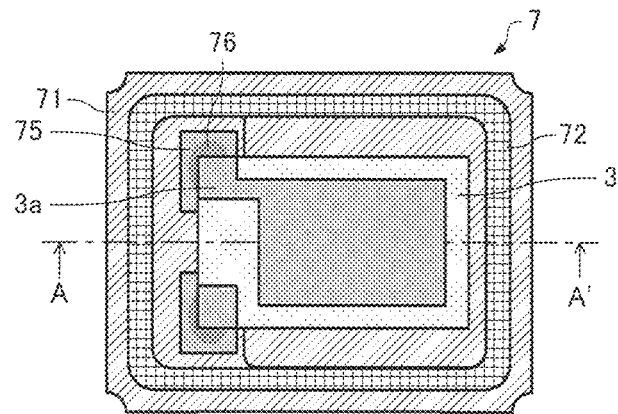
FIG. 10A is a top view illustrating a vibrator.
Figure 10B:
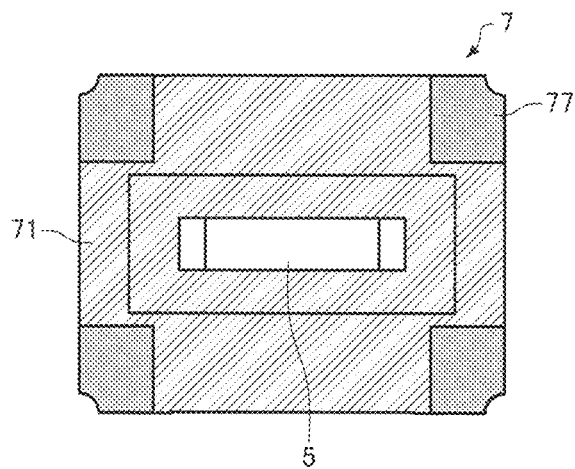
FIG. 10B is a bottom view illustrating the vibrator.
Figure 10C:
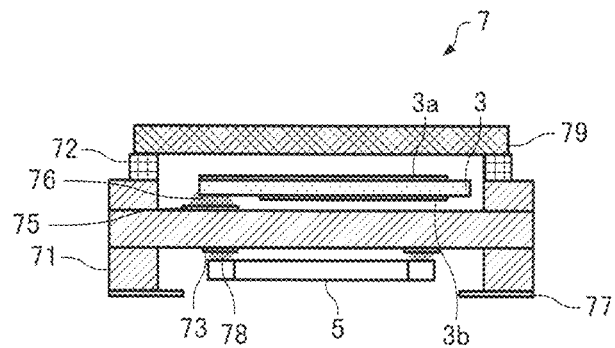
FIG. 10C is a bottom view illustrating the vibrator.
Figure 11:
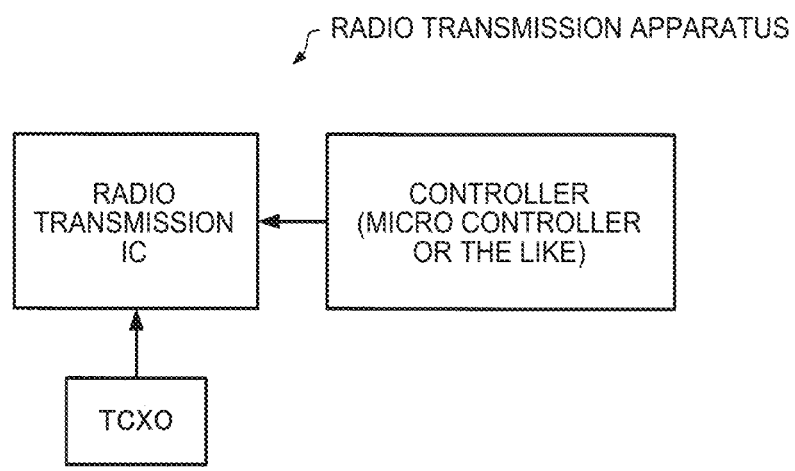
FIG. 11 is a diagram illustrating the configuration of a radio transmission apparatus of the related art.

FIGS. 10A to 10C are diagrams illustrating an example of the structure of the vibrator 7. FIG. 10A is a top view illustrating the vibrator 7. FIG. 10B is a bottom view illustrating the vibrator 7. FIG. 10C is a sectional view illustrating the vibrator 7 taken along the line XC-XC of FIG. 10A when viewed in a direction indicated by the arrow. FIG. 10A illustrates a state in which a lid 79 in FIG. 10C is not present.

As illustrated in FIGS. 10A to 10C, the vibrator 7 is configured to include the vibration element (vibration element) 3, the temperature detection element 5, a package 71, a seaming ring 72, and the lid (cover) 79.

As illustrated in FIG. 10C, two concave portions are formed in facing surfaces in the package 71. The vibration element 3 is accommodated in one concave portion and the temperature detection element 5 is accommodated in the other concave portion. Specifically, an opening is formed in the upper surface of the package 71 and the seaming ring 72 disposed to surround the opening of the upper surface of the package 71 and the lid 79 are welded to seal the opening of the upper surface of the package 71, so that the vibration element 3 is accommodated in the concave portion on the upper side of the package 71. An opening is also formed in the lower surface (bottom surface) of the package 71. The opening of the lower surface (bottom surface) of the package 71 is not sealed and the temperature detection element 5 is accommodated in the concave portion on the lower side of the package 71. Since the opening of the lower surface (bottom surface) of the package 71 is not sealed, the temperature detection element 5 can detect ambient temperature around the vibrator 7 (the vibration element 3).

The vibration element 3 includes the metal excitation electrodes 3a and 3b on the front and rear surfaces, respectively, and oscillates at a desired frequency according to the mass or the shape of the vibration element 3 including the excitation electrodes 3a and 3b. The vibration element 3 may be, for example, an AT vibration element. The vibration element 3 is fixed to electrode pads 75 disposed on the package 71 by a connection member 76 such as a conductive adhesive. The temperature detection element 5 may be, for example, a thermistor and both ends of the temperature detection element 5 are joined to electrode pads 73 disposed on the package 71 by a connection member 78 such as a conductive adhesive.

Wires (not illustrated) electrically connecting the two electrode pads 75 connected to two terminals (the excitation electrodes 3a and 3b) of the vibration element 3 and two XG and XD terminals (electrodes) 77 formed on the bottom surface of the package 71 are provided inside or on the front surface of the package 71.

Further, wires (not illustrated) electrically connecting the two electrode pads 73 respectively electrically connected to both ends of the temperature detection element 5 to the two TS and VSS terminals (electrodes) 77 formed on the bottom surface of the package 71 are provided inside or on the front surface of the package 71.

The radio transmission apparatus 1 having such a configuration according to the third embodiment has the same advantages as the first embodiment. Further, according to the third embodiment, as illustrated in FIGS. 10A to 10C, the vibration element 3 and the temperature detection element 5 are accommodated in one package 71. Further, in a plan view when the vibrator 7 is viewed from the upper surface, the vibration element 3 and the temperature detection element 5 overlap each other. Therefore, the radio transmission apparatus 1 can be miniaturized compared to a case in which the vibration element 3 and the temperature detection element 5 accommodated in separate packages are flatly disposed on the same substrate.

According to the third embodiment, since the vibration element 3 and the temperature detection element 5 are disposed at spatially close locations one another, a difference between the actual temperature of the vibration element 3 and the temperature detected by the temperature detection element 5 decreases. As a result, since a temperature compensation error decreases, it is possible to improve the frequency precision of the radio transmission signal.

2. Application Examples

The radio transmission apparatus 1 according to the above-described embodiments can be applied to various electronic apparatuses or systems. For example, the radio transmission apparatus 1 according to the above-described embodiments can be applied to, for example, a radio transmission apparatus which is included in a restaurant orderbell and wirelessly transmits information regarding pressing of a button, a radio transmission apparatus which is included in a remote controller for manipulation of a golf cart or the like and wirelessly transmits instruction information of a user to the golf cart, a radio transmission apparatus which is included in a temperature measurer of a green house or the like and wirelessly transmits temperature data, and a radio transmission apparatus which is included in an apparatus measuring vital data of a patient and wirelessly transmit the vital data. For example, it is also possible to construct a data collection system capable of collecting data measured and wirelessly transmitted by a plurality of data measurers in which the radio transmission apparatus 1 is included and performing various calculation processes.

The invention is not limited to the embodiment, but may be modified in various forms within the scope of the gist of the invention.

The above-described embodiments are merely examples and the invention is not limited thereto. For example, the embodiments can also be appropriately combined.

The invention includes configurations (for example, configurations of the same functions, methods, and results or configurations with the same objectives and advantages) which are substantially the same as the configurations described in the embodiments. The invention includes configurations in which portions not essential to the configurations described in the embodiments are substituted. The invention includes configurations in which configurations with the same operational advantages as the configurations described in the embodiments or the same objectives can be achieved. The invention includes configurations in which known technologies are added to the configurations described in the embodiments.

The entire disclosure of Japanese Patent Application No. 2015-095501, filed May 8, 2015 is expressly incorporated by reference herein.

What is claimed is:

1. A radio transmission apparatus comprising:
    a vibration element;
    a radio transmission semiconductor device that includes a fractional N-PLL circuit generating a radio transmission clock signal based on an output signal of the vibration element and a power amplifier generating a radio transmission signal based on the radio transmission clock signal;
    a control device that is configured to control the radio transmission semiconductor device; and
    a temperature detection element that is connected to the control device,
    wherein the control device is configured to control the fractional N-PLL circuit based on temperature information obtained from the temperature detection element such that a frequency of the radio transmission signal is temperature-compensated.

2. The radio transmission apparatus according to claim 1, wherein the temperature detection element is a thermistor that detects temperature of the vibration element.

3. The radio transmission apparatus according to claim 2, wherein the control device outputs a division set signal that is configured to set a division ratio of the fractional N-PLL circuit based on the temperature information.

4. The radio transmission apparatus according to claim 2, wherein the radio transmission semiconductor device includes a logic circuit and a plurality of registers,
    the logic circuit is configured to calculate a division ratio of the fractional N-PLL circuit based on setting values of the plurality of registers so that the logic circuit is configured to perform delta-sigma modulation to cause the fractional N-PLL circuit to generate the radio transmission clock signal.

5. The radio transmission apparatus according to claim 1, wherein the vibration element is an AT cut quartz crystal vibration element.

6. The radio transmission apparatus according to claim 1, wherein the radio transmission semiconductor device and the vibration element are accommodated in one package.

7. The radio transmission apparatus according to claim 1, wherein the temperature detection element and the vibration element are accommodated in one package.

8. The radio transmission apparatus according to claim 1, wherein the control device outputs a division set signal that is configured to set a division ratio of the fractional N-PLL circuit based on the temperature information.

9. The radio transmission apparatus according to claim 8, wherein the control device is configured to maintain a calculation formula or table information indicating a relation between an output voltage and the temperature of the temperature detection element.

10. The radio transmission apparatus according to claim 8,
    wherein the fractional N-PLL circuit is configured to generate the radio transmission clock signal having a frequency $F_{PLL}$, and
    wherein the control device is configured to maintain frequency-temperature characteristic information of the vibration element so as to calculate a frequency $F_{REF}$ of the vibration element based on the temperature information and to calculate an integer division ratio N and a fraction division ratio F/M based on:

$$F_{PLL} = \left(N + \frac{F}{M}\right) \times F_{REF}.$$

11. The radio transmission apparatus according to claim 6, wherein the radio transmission semiconductor device is configured to perform frequency shift keying modulation and amplitude shift keying modulation with respect to the radio transmission signal based on a control signal from the control device.

12. The radio transmission apparatus according to claim 1,
    wherein the radio transmission semiconductor device includes a logic circuit and a plurality of registers,
    the logic circuit is configured to calculate a division ratio of the fractional N-PLL circuit based on setting values of the plurality of registers so that the logic circuit is configured to perform delta-sigma modulation to cause the fractional N-PLL circuit to generate the radio transmission clock signal.

13. The radio transmission apparatus according to claim 12,
    wherein the control device is configured to maintain a calculation formula or table information indicating a relation between an output voltage and the temperature of the temperature detection element.

14. The radio transmission apparatus according to claim 12,
    wherein the fractional N-PLL circuit is configured to generate the radio transmission clock signal having a frequency $F_{PLL}$, and
    wherein the control device is configured to maintain frequency-temperature characteristic information of the vibration element so as to calculate a frequency $F_{REF}$ of the vibration element based on the temperature information and to calculate an integer division ratio N and a fraction division ratio F/M based on:

$$F_{PLL} = \left(N + \frac{F}{M}\right) \times F_{REF}.$$

15. The radio transmission apparatus according to claim 12,
wherein the radio transmission semiconductor device is configured to perform frequency shift keying modulation and amplitude shift keying modulation with respect to the radio transmission signal based on a control signal from the control device.

16. The radio transmission apparatus according to claim 1,
wherein the control device is configured to maintain a calculation formula or table information indicating a relation between an output voltage and the temperature of the temperature detection element.

17. The radio transmission apparatus according to claim 16,
wherein the fractional N-PLL circuit is configured to generate the radio transmission clock signal having a frequency $F_{PLL}$, and
wherein the control device is configured to maintain frequency-temperature characteristic information of the vibration element so as to calculate a frequency $F_{REF}$ of the vibration element based on the temperature information and to calculate an integer division ratio N and a fraction division ratio F/M based on:

$$F_{PLL} = \left(N + \frac{F}{M}\right) \times F_{REF}.$$

18. The radio transmission apparatus according to claim 1,
wherein the fractional N-PLL circuit is configured to generate the radio transmission clock signal having a frequency $F_{PLL}$, and
wherein the control device is configured to maintain frequency-temperature characteristic information of the vibration element so as to calculate a frequency $F_{REF}$ of the vibration element based on the temperature information and to calculate an integer division ratio N and a fraction division ratio F/M based on:

$$F_{PLL} = \left(N + \frac{F}{M}\right) \times F_{REF}.$$

19. The radio transmission apparatus according to claim 18,
wherein the radio transmission semiconductor device is configured to perform frequency shift keying modulation and amplitude shift keying modulation with respect to the radio transmission signal based on a control signal from the control device.

20. The radio transmission apparatus according to claim 1,
wherein the radio transmission semiconductor device is configured to perform frequency shift keying modulation and amplitude shift keying modulation with respect to the radio transmission signal based on a control signal from the control device.

\* \* \* \* \*